US007107508B2

(12) United States Patent
Jedwab et al.

(10) Patent No.: US 7,107,508 B2
(45) Date of Patent: Sep. 12, 2006

(54) MANUFACTURING TEST FOR A FAULT TOLERANT MAGNETORESISTIVE SOLID-STATE STORAGE DEVICE

(75) Inventors: Jonathan Jedwab, London (GB); James Andrew Davis, Richmond, VA (US); Kenneth Graham Paterson, Teddington (GB); Gadiel Seroussi, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 230 days.

(21) Appl. No.: 10/093,851

(22) Filed: Mar. 8, 2002

(65) Prior Publication Data

US 2003/0023928 A1 Jan. 30, 2003

Related U.S. Application Data

(63) Continuation-in-part of application No. 09/915,179, filed on Jul. 25, 2001, now abandoned.

(51) Int. Cl.
*G11C 29/00* (2006.01)

(52) U.S. Cl. .................................... 714/763
(58) Field of Classification Search ................ 714/763, 714/753, 755, 769, 758, 764; 257/295; 365/158, 365/171
See application file for complete search history.

(56) References Cited

U.S. PATENT DOCUMENTS

| 4,216,541 A | 8/1980 | Clover et al. .................. 371/38 |
| 4,458,349 A | 7/1984 | Aichelmann, Jr. et al. .... 371/13 |
| 4,845,714 A | 7/1989 | Zook .......................... 714/755 |
| 5,233,614 A | 8/1993 | Singh ......................... 371/21.6 |
| 5,263,030 A | 11/1993 | Roker et al. ................ 371/21.6 |
| 5,313,464 A | 5/1994 | Reif ............................ 371/2.1 |
| 5,321,703 A | 6/1994 | Weng ........................... 714/797 |
| 5,428,630 A | 6/1995 | Weng et al. ................ 371/40.1 |
| 5,488,691 A | 1/1996 | Fuoco et al. ............ 395/185.05 |
| 5,504,760 A | 4/1996 | Harari et al. ............... 371/40.1 |
| 5,590,306 A | 12/1996 | Watanabe et al. ............ 395/442 |
| 5,621,690 A | 4/1997 | Jungroth et al. ............. 365/200 |

(Continued)

FOREIGN PATENT DOCUMENTS

EP 1 132 924 A2 9/2001

(Continued)

OTHER PUBLICATIONS

Katayama, et al., "One-Shot Reed-Solomon Decoding for High-Performance Dependable Systems", *Proceedings International Conference on Dependable Systems and Networks 2000, DSN 2000*, pp. 390-399, Jun. 25-28, 2000.

(Continued)

*Primary Examiner*—James C. Kerveros

(57) ABSTRACT

A fault-tolerant magnetoresistive solid-state storage device (MRAM) in use performs error correction coding and decoding of stored information, to tolerate physical failures. At manufacture, the device is tested to confirm that each set of storage cells is suitable for storing ECC encoded data. The test comprises identifying failed cells where the failures will be visible in use for the generation of erasure information used in ECC decoding, by comparing parametric values obtained from the cells against one or more failure ranges, and includes performing a write-read-compare operation with test data to identify failed cells which will be hidden for the generation of erasure information in use. A failure count is formed based on both the visible failures and the hidden failures, to determine that the set of cells is suitable for storing ECC encoded data. The failure count is weighted, with hidden failures having a greater weighting than visible failures.

19 Claims, 5 Drawing Sheets

U.S. PATENT DOCUMENTS

| | | | |
|---|---|---|---|
| 5,793,795 A | 8/1998 | Li | 375/200 |
| 5,852,574 A | 12/1998 | Naji | 365/158 |
| 5,852,874 A | 12/1998 | Walker | 30/2 |
| 5,864,569 A | 1/1999 | Roohparvar | 371/40.18 |
| 5,953,351 A * | 9/1999 | Hicks et al. | 714/763 |
| 5,966,389 A | 10/1999 | Kiehl | 371/40.18 |
| 6,009,550 A * | 12/1999 | Gosula et al. | 714/769 |
| 6,112,324 A | 8/2000 | Howe et al. | 714/763 |
| 6,233,182 B1 | 5/2001 | Satou et al. | 365/200 |
| 6,249,475 B1 * | 6/2001 | Atwell et al. | 365/230.03 |
| 6,275,965 B1 | 8/2001 | Cox et al. | 714/755 |
| 6,381,726 B1 | 4/2002 | Weng | 714/780 |
| 6,407,953 B1 | 6/2002 | Cleeves | 365/201 |
| 6,408,401 B1 | 6/2002 | Bhavsar et al. | 714/7 |
| 6,456,525 B1 | 9/2002 | Perner et al. | 365/171 |
| 6,483,740 B1 | 11/2002 | Spitzer et al. | 365/158 |
| 6,574,775 B1 * | 6/2003 | Chouly | 714/800 |
| 6,684,353 B1 * | 1/2004 | Parker et al. | 714/718 |
| 6,856,572 B1 | 2/2005 | Scheuerlein et al. | 365/230.06 |
| 6,990,622 B1 | 1/2006 | Davis et al. | 714/763 |
| 2002/0029341 A1 | 3/2002 | Juels et al. | 713/184 |
| 2003/0156469 A1 | 8/2003 | Viehmann et al. | 365/200 |
| 2003/0172339 A1 | 9/2003 | Davis et al. | 714/763 |

FOREIGN PATENT DOCUMENTS

| | | |
|---|---|---|
| JP | 03-244218 | 10/1991 |
| JP | 10-261043 | 9/1998 |

OTHER PUBLICATIONS

Katayama, et al., "One-Shot Reed-Solomon Decoding for High-Performance Dependable Systems", *Proceedings International Conference on Dependable Systems and Networks 2000, DSN 2000*, pp. 390-399, Jun. 25-28, 2000.

* cited by examiner ns that will be visible when generating erasure information in use; identifying storage cells within the selected set as hidden failures, wherein a storage cell is affected by a physical failure that will be hidden when generating erasure information in use; determining whether the selected set of storage cells is suitable for, in use, storing the at least one block of ECC encoded data, taking account of the identified visible failures and the identified hidden failures.

MANUFACTURING TEST FOR A FAULT TOLERANT MAGNETORESISTIVE SOLID-STATE STORAGE DEVICE

CROSS REFERENCE TO RELATED APPLICATIONS

This application is a continuation-in-part of application No. 09/915,179, filed on Jul. 25, 2001 now abandoned.

The present invention relates in general to a magnetoresistive solid-state storage device and to a method for testing a magnetoresistive solid-state storage device. In particular, but not exclusively, the invention relates to a method for testing a magnetoresistive solid-state storage device that in use will employ error correction coding (ECC).

A typical solid-state storage device comprises one or more arrays of storage cells for storing data. Existing semiconductor technologies provide volatile solid-state storage devices suitable for relatively short term storage of data, such as dynamic random access memory (DRAM), or devices for relatively longer term storage of data such as static random access memory (SRAM) or non-volatile flash and EEPROM devices. However, many other technologies are known or are being developed.

Recently, a magnetoresistive storage device has been developed as a new type of non-volatile solid-state storage device (see, for example, EP-A-0918334 Hewlett-Packard). The magnetoresistive solid-state storage device is also known as a magnetic random access memory (MRAM) device. MRAM devices have relatively low power consumption and relatively fast access times, particularly for data write operations, which renders MRAM devices ideally suitable for both short term and long term storage applications.

A problem arises in that MRAM devices are subject to physical failure, which can result in an unacceptable loss of stored data. Currently available manufacturing techniques for MRAM devices are subject to limitations and as a result manufacturing yields of commercially acceptable MRAM devices are relatively low. Although better manufacturing techniques are being developed, these tend to increase manufacturing complexity and cost. Hence, it is desired to apply lower cost manufacturing techniques whilst increasing device yield. Further, it is desired to increase cell density formed on a substrate such as silicon, but as the density increases manufacturing tolerances become increasingly difficult to control, again leading to higher failure rates and lower device yields. Since the MRAM devices are at a relatively early stage in development, it is desired to allow large scale manufacturing of commercially acceptable devices, whilst tolerating the limitations of current manufacturing techniques.

BRIEF SUMMARY OF THE INVENTION

An aim of the present invention is to provide a method for testing a magnetoresistive solid-state storage device. A preferred aim is to provide a test which may be employed at manufacture of a device, preferably prior to storage of active user data.

According to a first aspect of the present invention there is provided a method for testing a magnetoresistive solid-state storage device, comprising the steps of: selecting a set of magnetoresistive storage cells, the set being arranged in use to store at least one block of ECC encoded data; identifying storage cells within the selected set as visible failures, wherein a storage cell is affected by a physical failure that will be visible when generating erasure information in use; identifying storage cells within the selected set as hidden failures, wherein a storage cell is affected by a physical failure that will be hidden when generating erasure information in use; determining whether the selected set of storage cells is suitable for, in use, storing the at least one block of ECC encoded data, taking account of the identified visible failures and the identified hidden failures.

The method preferably comprises performing a write-read-compare operation on the selected set of storage cells, to identify hidden failures. Here, the write-read-compare operation comprises: writing test data to the selected set of storage cells; reading the test data from the selected set of storage cells; and comparing the written test data to the read test data to identify a failed cell or cells amongst the set of storage cells as being affected by a physical failure that will, in use, be hidden when generating erasure information. Preferably, the hidden failures include half-select bits or single failed bits.

Preferably, the method comprises comparing a parametric value obtained from each storage cell against a range or ranges to identify visible failures. Here, the method preferably comprises obtaining a parametric value for each of the set of storage cells; comparing each parametric value against a range or ranges; and identifying a failed cell or cells, amongst the set of storage cells, as being affected by a physical failure, where the parametric value falls into a failure range.

Preferably, the method comprises forming a failure count based on the identified visible failures and the identified hidden failures; and comparing the failure count against a threshold value. Preferably, the failure count is formed for each block of storage cells which will, in use, store a block of ECC encoded data. Preferably, the block of cells comprises a plurality of symbol groups, each symbol group comprising one or more storage cells which will in use store a symbol of ECC encoded data. Preferably, forming the failure count comprises: applying a weighted value to each symbol group; and summing the weighted values for the symbol groups within each block of storage cells. Here, the method preferably comprises applying a first weighted value where any storage cell in a symbol group is identified as a visible failure; and applying a second weighted value where any storage cell in a symbol group is identified as a hidden failure. Preferably, the second weighted value has twice the weight of the first weighted value. Suitably, the first weighted value is applied in precedence to the second weighted value. Preferably, the method comprises applying a third weighted value to each symbol group not applied the first weighted value or the second weighted value, the third weighted value having a null weight.

Preferably, the threshold value represents a maximum power of an ECC scheme to be employed in use to reliably correct a block of ECC encoded data. Here, the threshold value is set to be in the range of about 50% to about 95% of the maximum power.

According to a second aspect of the present invention there is provided a magnetoresistive solid-state storage device, comprising: at least one array of magnetoresistive storage cells; an ECC unit for, in use, encoding original information to form at least one block of ECC encoded data, and for decoding ECC encoded data to recover information; a controller arranged, in use, to store the at least one block of ECC encoded data in a set of the storage cells, and to read the stored ECC encoded data from the storage cells; and a test unit arranged to select a set of magnetoresistive storage cells, the set being arranged in use to store at least one block of ECC encoded data, to identify storage cells within the selected set as visible failures, wherein a storage cell is affected by a physical failure that will be visible when generating erasure information in use, to identify storage cells within the selected set as hidden failures, wherein a storage cell is affected by a physical failure that will not be hidden when generating erasure information in use, and to determine whether the selected set of storage cells is suitable for, in use, storing the at least one block of ECC encoded data, taking account of the identified visible failures and the identified hidden failures.

The present invention also extends to an apparatus incorporating the magnetoresistive solid-state storage device defined herein.

BRIEF DESCRIPTION OF THE DRAWINGS

For a better understanding of the invention, and to show how embodiments of the same may be carried into effect, reference will now be made, by way of example, to the accompanying diagrammatic drawings in which.

DETAILED DESCRIPTION OF THE INVENTION

To assist a complete understanding of the present invention, an MRAM device will first be described with reference to FIG. 1, including a description of the failure mechanisms found in example forms of MRAM devices. A preferred logical data structure will then be described with reference to FIG. 2, employed when storing ECC encoded data in the device in use. A storage cell will be described in more detail referring to FIG. 3. A preferred method for reading ECC encoded data from an MRAM device in use will be described with reference to FIG. 4. Finally, the preferred method for testing an MRAM device will be described with reference to FIG. 5.

Figure 1:
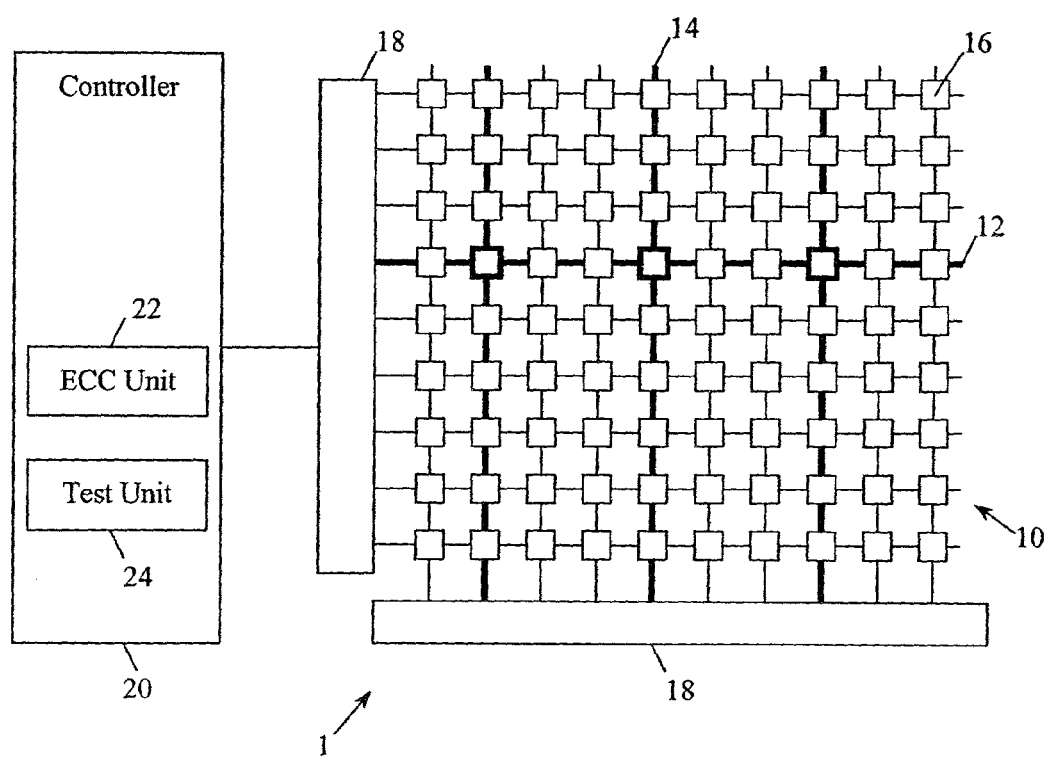
FIG. 1 is a schematic diagram showing a preferred MRAM device including an array of storage cells.

FIG. 1 shows a simplified magnetoresistive solid-state storage device 1 comprising an array 10 of storage cells 16. The array 10 is coupled to a controller 20 which, amongst other control elements, includes an ECC coding and decoding unit 22 and a test unit 24. The controller 20 and the array 10 can be formed on a single substrate, or can be arranged separately. If desired, the test unit 24 is arranged physically separate from the MRAM device 1 and they are coupled together when it is desired to test the MRAM device.

In one preferred embodiment, the array 10 comprises of the order of 1024 by 1024 storage cells, just a few of which are illustrated. The cells 16 are each formed at an intersection between control lines 12 and 14. In this example control lines 12 are arranged in rows, and control lines 14 are arranged in columns. One row 12 and one or more columns 14 are selected to access the required storage cell or cells 16 (or conversely one column and several rows, depending upon the orientation of the array). Suitably, the row and column lines are coupled to control circuits 18, which include a plurality of read/write control circuits. Depending upon the implementation, one read/write control circuit is provided per column, or read/write control circuits are multiplexed or shared between columns. In this example the control lines 12 and 14 are generally orthogonal, but other more complicated lattice structures are also possible.

In a read operation of the currently preferred MRAM device, a single row line 12 and several column lines 14 (represented by thicker lines in FIG. 1) are activated in the array 10 by the control circuits 18, and a set of data read from those activated cells. This operation is termed a slice. The row in this example is 1024 storage cells long l and the accessed storage cells 16 are separated by a minimum reading distance m, such as sixty-four cells, to minimise cross-cell interference in the read process. Hence, each slice provides up to $l/m=1024/64=16$ bits from the accessed array.

To provide an MRAM device of a desired storage capacity, preferably a plurality of independently addressable arrays 10 are arranged to form a macro-array. Conveniently, a small plurality of arrays (typically four) are layered to form a stack, and plural stacks are arranged together, such as in a 16×16 layout. Preferably, each macro-array has a 16×18×4 or 16×20×4 layout (expressed as width×height×stack layers). Optionally, the MRAM device comprises more than one macro-array. In the currently preferred MRAM device only one of the four arrays in each stack can be accessed at any one time. Hence, a slice from a macro-array reads a set of cells from one row of a subset of the plurality of arrays 10, the subset preferably being one array within each stack.

Each storage cell 16 stores one bit of data suitably representing a numerical value and preferably a binary value, i.e. one or zero. Suitably, each storage cell includes two films which assume one of two stable magnetisation orientations, known as parallel and anti-parallel. The magnetisation orientation affects the resistance of the storage cell. When the storage cell 16 is in the anti-parallel state, the resistance is at its highest, and when the magnetic storage cell is in the parallel state, the resistance is at its lowest. Suitably, the anti-parallel state defines a zero logic state, and the parallel state defines a one logic state, or vice versa. As further background information, EP-A-0 918 334 (Hewlett-Packard) discloses one example of a magnetoresistive solid-state storage device which is suitable for use in preferred embodiments of the present invention.

Although generally reliable, it has been found that failures can occur which affect the ability of the device to store data reliably in the storage cells 16. Physical failures within an MRAM device can result from many causes including manufacturing imperfections, internal effects such as noise in a read process, environmental effects such as temperature and surrounding electromagnetic noise, or agreeing of the device in use. In general, failures can be classified as either systematic failures or random failures. Systematic failures consistently affect a particular storage cell or a particular group of storage cells. Random failures occur transiently and are not consistently repeatable. Typically, systematic failures arise as a result of manufacturing imperfections and agreeing, whilst random failures occur in response to internal effects and to external environmental affects.

Failures are highly undesirable and mean that at least some storage cells in the device cannot be written to or read from reliably. A cell affected by a failure can become unreadable, in which case no logical value can be read from the cell, or can become unreliable, in which case the logical value read from the cell is not necessarily the same as the value written to the cell (e.g. a "1" is written but a "0" is read). The storage capacity and reliability of the device can be severely affected and in the worst case the entire device becomes unusable.

Failure mechanisms take many forms, and the following examples are amongst those identified:

1. Shorted bits—where the resistance of the storage cell is much lower than expected. Shorted bits tend to affect all storage cells lying in the same row and the same column.
2. Open bits—where the resistance of the storage cell is much higher than expected. Open bit failures can, but do not always, affect all storage cells lying in the same row or column, or both.
3. Half-select bits—where writing to a storage cell in a particular row or column causes another storage cell in the same row or column to change state. A cell which is vulnerable to half select will therefore possibly change state in response to a write access to any storage cell in the same row or column, resulting in unreliable stored data.
4. Single failed bits—where a particular storage cell fails (e.g. is stuck always as a "0"), but does not affect other storage cells and is not affected by activity in other storage cells.

These four example failure mechanisms are each systematic, in that the same storage cell or cells are consistently affected. Where the failure mechanism affects only one cell, this can be termed an isolated failure. Where the failure mechanism affects a group of cells, this can be termed a grouped failure.

Whilst the storage cells of the MRAM device can be used to store data according to any suitable logical layout, data is preferably organized into basic data units (e.g. bytes) which in turn are grouped into larger logical data units (e.g. sectors). A physical failure, and in particular a grouped failure affecting many cells, can affect many bytes and possibly many sectors. It has been found that keeping information about logical units such as bytes affected by physical failures is not efficient, due to the quantity of data involved. That is, attempts to produce a list of all such logical units rendered unusable due to at least one physical failure, tend to generate a quantity of management data which is too large to handle efficiently. Further, depending on how the data is organized on the device, a single physical failure can potentially affect a large number of logical data units, such that avoiding use of all bytes, sectors or other units affected by a failure substantially reduces the storage capacity of the device. For example, a grouped failure such as a shorted bit failure in just one storage cell affects many other storage cells, which lie in the same row or the same column. Thus, a single shorted bit failure can affect 1023 other cells lying in the same row, and 1023 cells lying in the same column—a total of 2027 affected cells. These 2027 affected cells may form part of many bytes, and many sectors, each of which would be rendered unusable by the single grouped failure.

Some improvements have been made in manufacturing processes and device construction to reduce the number of manufacturing failures and improve device longevity, but this usually involves increased manufacturing costs and complexity, and reduced device yields. Hence, techniques are being developed which respond to failures and avoid future loss of data.

The MRAM devices of the preferred embodiments of the present invention in use employ error correction coding to provide a device which is error tolerant, preferably to tolerate and recover from both random failures and systematic failures. Typically, error correction coding involves receiving original information which it is desired to store and forming encoded data which allows errors to be identified and ideally corrected. The encoded data is stored in the solid-state storage device. At read time, the original information is recovered by error correction decoding the encoded stored data. A wide range of error correction coding (ECC) schemes are available and can be employed alone or in combination. Suitable ECC schemes include both schemes with single-bit symbols (e.g. BCH) and schemes with multiple-bit symbols (e.g. Reed-Solomon).

As general background information concerning error correction coding, reference is made to the following publication: W. W. Peterson and E. J. Weldon, Jr., "Error-Correcting Codes", $2^{nd}$ edition, $12^{th}$ printing, 1994, MIT Press, Cambridge Mass.

A more specific reference concerning Reed-Solomon codes used in the preferred embodiments of the present invention is: "Reed-Solomon Codes and their Applications", ED. S. B. Wicker and V. K. Bhargava, IEEE Press, New York, 1994.

Figure 2:
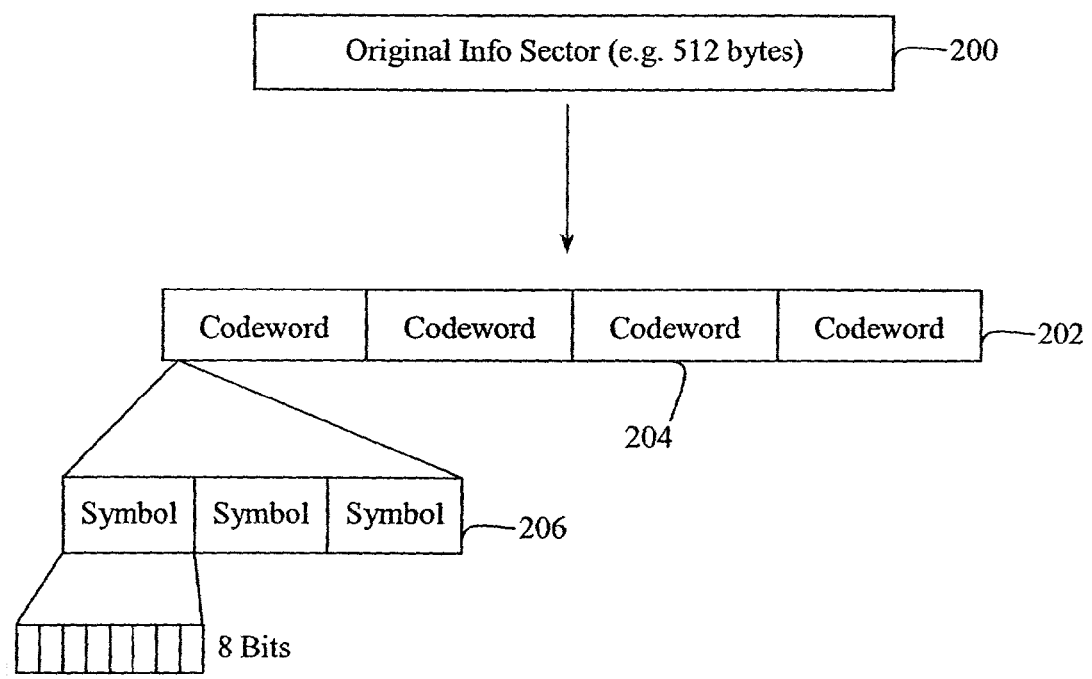
FIG. 2 shows a preferred logical data structure.

FIG. 2 shows an example logical data structure used when storing active data in the MRAM device 10. Original information 200 is received in predetermined units such as a sector comprising 512 bytes. Error correction coding is performed to produce ECC encoded data, in this case an encoded sector 202. The encoded sector 202 comprises a plurality of symbols 206 which can be a single bit (e.g. a BCH code with single-bit symbols) or can comprise multiple bits (e.g. a Reed-Solomon code using multi-bit symbols). In the preferred Reed-Solomon encoding scheme, each symbol 206 conveniently comprises eight bits and, as shown in FIG. 2, each encoded sector 202 comprises four codewords 204, each comprising of the order of 144 to 160 symbols. The eight bits corresponding to each symbol are conveniently stored in eight storage cells 16, which can be termed a symbol group. A physical failure which directly or indirectly affects any of these eight storage cells in a symbol group can result in one or more of the bits being unreliable (i.e. the wrong value is read) or unreadable (i.e. no value can be obtained), giving a failed symbol.

In the current MRAM devices, grouped failures tend to affect a large group of storage cells, sharing the same row or column. This provides an environment which is unlike prior storage devices. The preferred embodiments of the present invention employ an ECC scheme with multi-bit symbols. Where manufacturing processes and device design change over time, it may become more appropriate to organize storage locations expecting bit-based errors and then apply an ECC scheme using single-bit symbols, and at least some of the following embodiments can be applied to single-bit symbols.

Error correction decoding each block of stored ECC encoded data allows failed symbols 206 to be identified and corrected. Conveniently, decoding is performed independently for each block of ECC encoded data, such as an ECC encoded sector 202 or, in the preferred embodiment, for each codeword 204. The preferred Reed-Solomon scheme is an example of a linear error correcting code, which mathematically identifies and corrects completely up to a predetermined maximum number of failed symbols 206 within each independently decodeable block of ECC encoded data, depending upon the power of the code. For example, a [160,128,33] Reed-Solomon code producing codewords having one hundred and sixty 8-bit symbols corresponding to one hundred and twenty-eight original information bytes and a minimum distance of thirty-three symbols can locate and correct up to sixteen symbol errors.

Suitably, the ECC scheme employed is selected with a power sufficient to recover original information 200 from the encoded data in substantially all cases. Pictorially, each perfect block of ECC encoded data represents a point in space, and a reliably correctable form of that block of ECC encoded data lies within a "ball" having a radius corresponding to the maximum power of the ECC encoding scheme. Very rarely, a block of encoded data is encountered which is affected by so many failures that the original information 200 is unrecoverable. Here, the ECC decoding unit 22 is presented with a block of ECC encoded data which is so severely affected by physical failures that it lies outside the ball of all reliably correctable blocks of ECC encoded data. Also, even more rarely, the failures result in a mis-correct, where information recovered from the encoded data 202 is not equivalent to the original information 200. Even though the recovered information does not correspond to the original information, a mis-correct is not readily determined. Pictorially, the ECC decoding unit 22 is presented with a block of ECC encoded data which is so severely affected by physical failures that it lies inside an incorrect ball, i.e. not the ball corresponding to the perfect form of that block of ECC encoded data. Ideally, the ECC scheme is selected such that the probability of encountering an unrecoverable or mis-corrected block of ECC encoded data is extremely small, suitably of the order of $10^{-15}$ to $10^{-20}$.

Referring again to FIG. 1, the MRAM device 1 in use stores ECC encoded data in the storage cells 16 by writing logical values to the storage cells. Advantageously, the preferred MRAM device requires no power to maintain the state of each storage cell.

In general terms, at read time the storage cells are accessed in a read operation, wherein a read voltage is applied along a row line and one or more column control lines 12, 14 causing a sense current to flow through selected storage cells 16. In one example construction of an MRAM device 1, each storage cell 16 has a resistance determined by parallel or anti-parallel alignment of the two magnetic films. Here, the resistance of each storage cell 16 is determined according to a phenomenon known as spin tunnelling and the cells are often referred to as magnetic tunnel junction storage cells. The condition of the storage cell is determined by measuring the sense current (proportional to resistance) or a related parameter such as response time to discharge a known capacitance, which gives one or more parametric values for each of the accessed storage cells. Depending upon the nature and construction of the MRAM device, the read operation may comprise multiple steps or require combined read and rewrite actions.

The parametric values obtained from the storage cells 16 are compared against a range or ranges. The comparison in almost all cases allows a logical value (e.g. one or zero) to be established for each cell. However, it has been found that this comparison also conveniently allows at least some forms of physical failure to be identified. For example, it has been determined that, in at least some MRAM devices, a shorted bit failure leads to a very low resistance value in all cells of a particular row and a particular column. Also, open-bit failures can cause a very high resistance value for all cells of a particular row and column. By comparing the obtained parametric values against a range or ranges, cells affected by failures such as shorted-bit and open-bit failures can be identified with a high degree of certainty.

Figure 3:
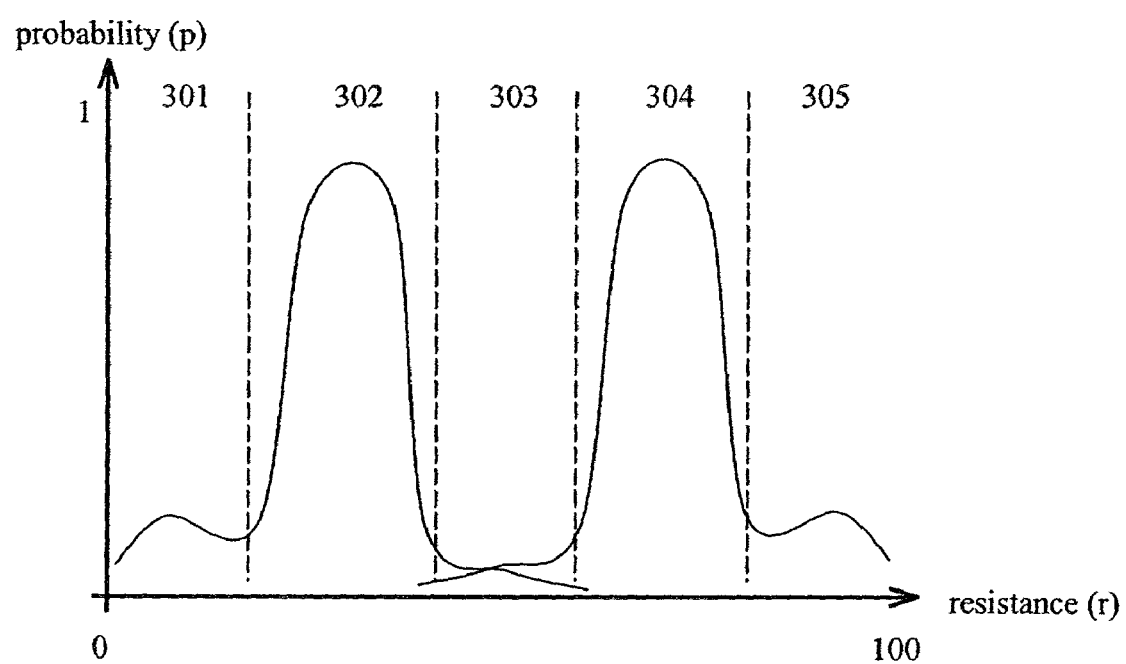
FIG. 3 is a graph illustrating a parametric value obtained from a storage cell of an MRAM device.

FIG. 3 is a graph as an illustrative example of the probability (p) that a particular cell will have a certain parametric value, in this case resistance (r), corresponding to a logical "0" in the left-hand curve, or a logical "1" in the right-hand curve. As an arbitrary scale, probability has been given between 0 and 1, whilst resistance is plotted between 0 and 100%. The resistance scale has been divided into five ranges. In range 301, the resistance value is very low and the range represents a shorted-bit failure with a reasonable degree of certainty. Range 302 represents a low resistance value within expected boundaries, which in this example is determined as equivalent to a logical "0". Range 303 represents a medium resistance value where a logical value cannot be ascertained with sufficient certainty. Range 304 is a high resistance range representing a logical "1". Range 305 is a very high resistance value where an open-bit failure can be predicted with a high degree of certainty. The ranges shown in FIG. 3 are purely for illustration, and many other possibilities are available depending upon the physical construction of the MRAM device 1, the manner in which the storage cells are accessed, and the parametric values obtained. The range or ranges are suitably calibrated depending, for example, on environmental factors such as temperature, factors affecting a particular cell or cells and their position within array, or the nature of the cells themselves and the type of access employed.

Figure 4:
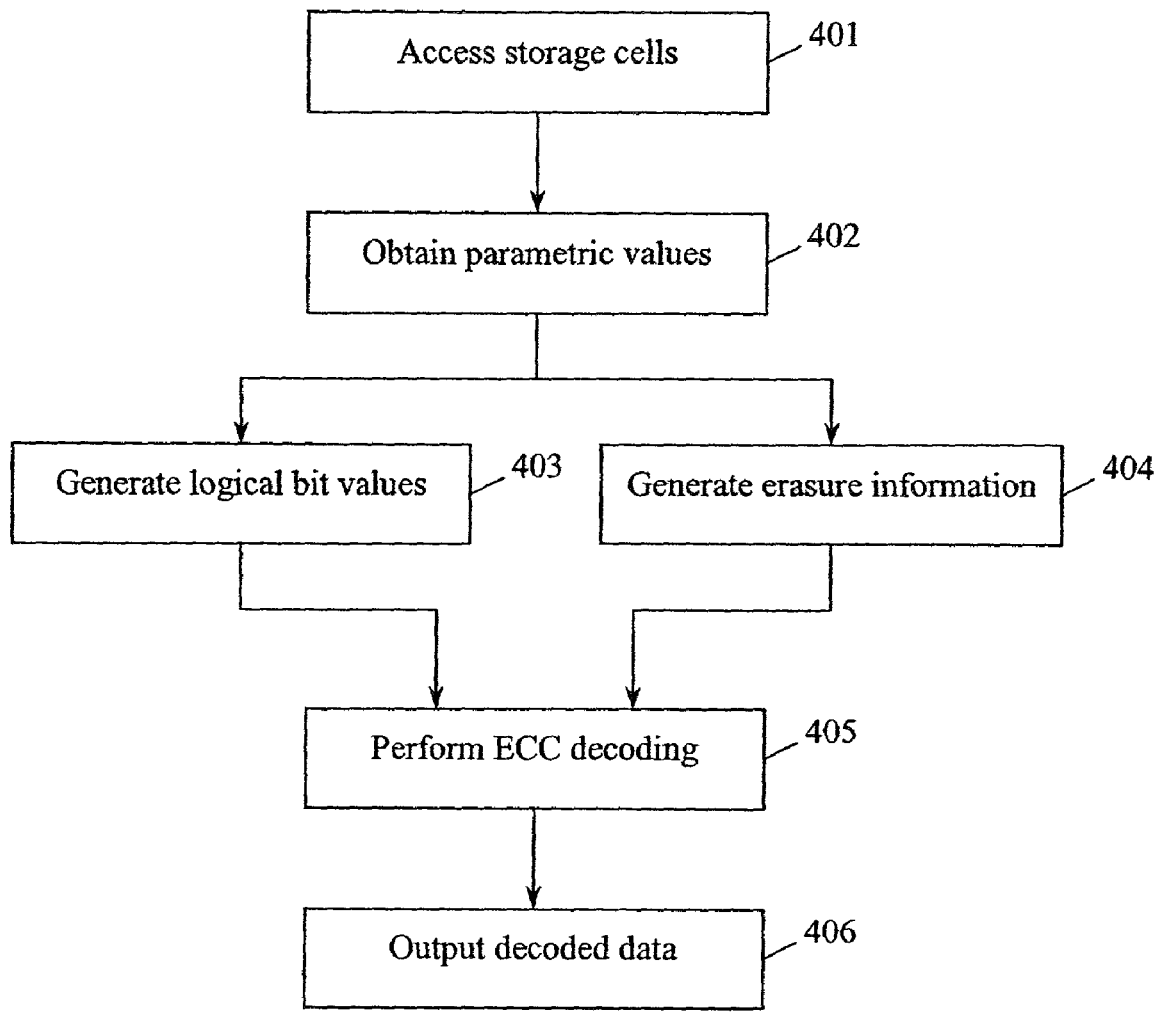
FIG. 4 shows a preferred method for reading stored data from an MRAM device in use.

FIG. 4 shows a preferred method for reading ECC encoded data from the MRAM device 1. This method is particularly suitable for reading stored data from the MRAM device, in active use.

Step 401 comprises accessing a plurality of the storage cells 16, conveniently using the read operation discussed with reference to FIG. 3. In use, the accessed plurality of storage cells conveniently correspond to at least one block of ECC encoded data, such as a codeword 204 or a complete encoded sector 202.

Step 402 comprises obtaining parametric values relating to the storage cells 16, as a result of the access made in step 401. For the preferred MRAM device, the parametric value is suitably derived from a sense current and represents cell resistance or response time. Optionally, more than one parametric value is obtained for each cell 16.

Step 403 comprises generating logical bit values from the obtained parametric values. Here, the sensed parametric values are compared against a range or ranges, and in most cases a logical value such as a binary 1 or 0 is successfully derived. Optionally, when it is not possible to generate a logical bit value with sufficient confidence, then the steps 401 and 402 are immediately repeated, in the hope of avoiding, for example, a transient or random error. However, particularly with currently available MRAM devices, a small number of systematic failures should be expected when accessing a significant number of storage cells, such as the set of storage cells corresponding to an ECC codeword 204 or an encoded sector 202.

Step 404 comprises generating erasure information. That is, a cell 16 is identified as being affected by a failure, where the obtained parametric value corresponds to a failure range or any one of several failure ranges. In particular, a storage cell 16 is identified as a failure where no logical value could be obtained, or where the logical value is considered to be unreliable. Here, it is convenient to prepare the erasure information in parallel with generating logical bit values in step 403. In the currently preferred embodiments, each storage cell 16 stores a single logical bit value representing a binary 1 or 0, and multiple bits are gathered together to form a symbol 206. Preferably, the erasure information is prepared on the basis that a symbol 206 is declared as an erasure where any one or more of the bits in that symbol corresponds to a failed storage cell 16 The erasure information can be generated directly from the obtained parametric values, or can be obtained indirectly involving one or more intermediate steps.

The logical values and erasure information can be presented in any suitable form. In one example, the logical bit values are determined with hard decisions as to the value of each bit, or else the bit is determined as a failure and erasure information generated accordingly. In a second example, preferably soft decisions are made as to the relative certainty with which each bit is allocated a logical value or declared as a failure. For example, the cells are ranked in order of quality, and only the n most severely affected cells amongst the cells of interest lead to erasures. Ideally, the logical symbol values and erasure information are arranged to form an input (or inputs) to the ECC decoder 22.

Step 405 comprises error correction decoding the block of stored ECC encoded data, using the symbol logical values generated in step 403 and taking account of the erasure information generated in step 404. In the preferred ECC coding scheme, each codeword 204 is decoded in isolation, and the results from ECC decoding plural codewords (in this case four codewords) provides ECC decoded data corresponding to an original information sector 200. Advantageously, the error correction decoding of step 405 is able to correct a greater number of errors using the erasure information generated in step 404, compared with a situation where this erasure information is not available.

In step 406, the recovered data produced by the ECC decoding of step 405 is output, corresponding to the original information 200.

In this context, it is desired to identify portions of an MRAM device 1 which are most severely affected by failed storage cells. In particular, it is desired to identify portions of the device which are so severely affected by failed storage cells that the ECC scheme will not reliably correct the stored data, leading to the possibility that information is unrecoverable or a mis-correct occurs.

In use, when the MRAM device is storing active user data, then at read time some forms of cell failures, such as those caused by shorted-bits and open-bits, can be determined with a high degree of certainty, and used to form erasure information which improves the ability of the ECC decoder 22 correctly to recover original information 200 from the stored ECC encoded data. These failures can be termed as being visible for the generation of erasure information. By contrast, it has been found that other forms of systematic failures, particularly half-select failures or single-bit failures (e.g. a cell that is always stuck on "0"), are not readily detectable at read time, and can be said to be hidden for the generation of erasure information. These hidden failures are, in almost all cases, correctable by decoding the ECC encoded data stored in the device. However, this need for decoding increases the load and responsibility placed on the ECC decoder 22, or equivalent unit. Hence, it is desired to identify those portions of the device which are most severely affected by failures, and in particular to take account of both the visible failures and the hidden failures.

Figure 5:
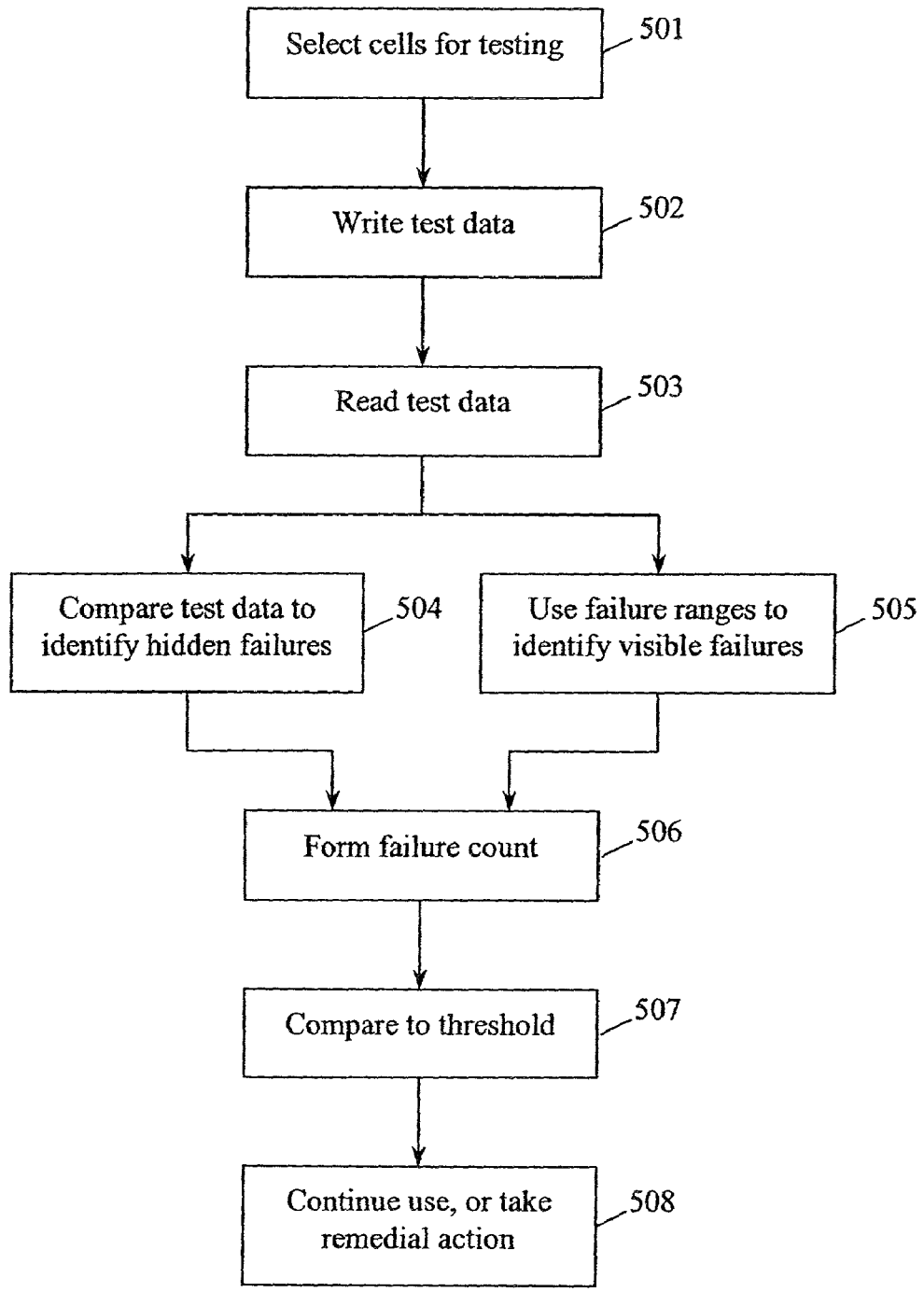
FIG. 5 shows a preferred method for testing an MRAM device.

In response to these problems, FIG. 5 shows a preferred method for testing an MRAM device. This test method is ideally suitable to be employed, for example, at manufacture of the MRAM device 1. The MRAM device to be tested is suitably arranged as discussed above with reference to FIGS. 1 and 3, and, in use, will store ECC encoded data as discussed with reference to FIGS. 2 and 4.

Briefly, the method of FIG. 5 employs complementary forms of evaluation to determine portions of the MRAM device 1 where the storage cells 16 are affected by visible failures, and by hidden failures.

In step 501 a set of storage cells are selected for testing. The selected set of storage cells suitably correspond to a set of cells which, in use, would be used to store at least one block of ECC encoded data such as an encoded sector 202 or a codeword 204. The selected set of storage cells represents a sufficient number of storage cells for the following steps to be performed, and any suitable set of storage cells can be selected. In the currently preferred embodiments, it is convenient for the selected set of storage cells to represent, in use, a single codeword, or an integer number of codewords.

Step 502 comprises writing test data to the selected set of storage cells 16. This test data may take any suitable form. Conveniently, the test data represents a regular and predictable pattern of data (e.g. all "1"s or all "0"s). Here, the test data may, or may not, include ECC encoded data.

In step 503, the test data is read from the storage cell 16. The read procedure is conveniently of a general form discussed above with reference to FIG. 4.

In step 504, the written test data and the read test data are compared, to identify suspected failed cells. If desired, this write-read-compare operation can be repeated one or more times, to increase confidence that failed cells have been correctly identified. Using this write-read-compare operation, many different types of failures can be identified. By selecting appropriate test data, cells affected by hidden failures, such as half-select failures or single-bit failures, can be identified in the test procedure. These hidden failures are, by contrast, not readily identifiable when the device is in use storing active user data.

Step 505 comprises determining storage cells affected by visible failures, i.e. those failures which are readily identifiable in active use. This step conveniently comprises obtaining a plurality of parametric values associated with the selected set of storage cells, and comparing those parametric values against one or more failure ranges. In the example MRAM device 1, comparing the obtained parametric values against failure ranges allows cells affected by failures such as shorted-bit and open-bit failures to be identified with a high degree of certainty.

It will be appreciated that step 505 can be performed as a separate step, either prior to or after the write-read-compare operation of steps 502 to 504. In the example MRAM device, the intended state of the storage cell (i.e. storing a logical "1" or "0") is not particularly relevant, because the types of failure involved mean that the cell does not respond as intended. However, it is most convenient to perform the parametric evaluation of step 505 alongside reading the test data from the storage cells, as in step 503. That is, a single read operation allows visible failures to be determined, and also provides logical data values of the read test data, which allows hidden failures to be determined.

In step 506, a failure count is formed. The failure count is based upon both the storage cells determined as visible failures and the storage cells determined as hidden failures. Most conveniently, the count is performed on the basis of symbols 206 (each containing one or more bits) which would, in use, be affected by the identified failed cells. That is, it is convenient to perform the test method on the basis of a set of storage cells which will, in use, store an integer number of codewords of ECC encoded data, and to form a failure count for each codeword on the basis of the number of symbols in that codeword that would be affected by failed storage cells.

In the preferred method, the failure count is weighted according to whether the identified failures are visible for generating erasure information in active use, or will be hidden for the generation of erasure information. Here, as discussed above with reference to FIG. 4, the ECC encoding scheme to be employed in use takes advantage of erasure information which allows up to twice as many failed symbols to be corrected. Hence, it is convenient to weight the hidden failures as twice the value of the visible failures. That is, in the preferred failure count, the visible failures are weighted with a value of "1", whilst the hidden failures are weighted with a value of "2".

In more detail, the preferred count is formed on the basis of each group of cells which will, in use, store one symbol 206. If this symbol group is affected by one or more visible failures then a value of "1" is given to that symbol group. Similarly, if a symbol group is affected by one or more hidden failures then a value of "2" is given to that symbol group. Conveniently, if the symbol group is affected by one or more hidden failures as well as one or more visible failures, then the visible failures take precedence, and the symbol group is given a value of "1". Where a symbol group is not affected by either visible failures or hidden failures, then it is given a null value of "0".

The failure count for each block of ECC encoded data, i.e. for each codeword 204, is formed by summing the weighted values allocated to each symbol group within that block.

In step 507, the failure count is compared against a predetermined threshold value.

Since, in use, the data to be stored in the storage cells represents blocks of ECC encoded data, it is possible that ECC decoding will not correctly recover the original data, where the number of failed symbols in a block is greater than the maximum power of the ECC scheme. Hence, the threshold value is suitably selected to represent a value which is equal to or less than the maximum number of failed symbols which the ECC scheme is able to correct reliably.

As mentioned above, the [160,128,33] Reed-Solomon ECC scheme to be employed in use can reliably correct any combination of full errors and erasures provided that: (number of erasures)+2*(number of full errors)<=(one less than the minimum distance of the decoder). Hence, the maximum power of the ECC scheme in the preferred embodiment is represented by a threshold value of 32.

Preferably, the threshold value is selected to be substantially less than the maximum power of the ECC decoding scheme, suitably of the order of 50% to 95% of the maximum power. In a particular preferred embodiment the threshold value is selected to represent about 50% to 75% and suitably about 60% of the maximum power of the employed ECC scheme.

Although currently available MRAM devices have been found to be remarkably reliable, it is possible that MRAM devices will age with use, and that additional systematic errors may occur over time. More prominently, it is possible that random failures will occur transiently in use, due to environmental conditions (e.g. due to a strong magnetic field). This leads to a preferred threshold in the test procedure which would allow a minimum number of new full errors to be reliably identified and corrected in use, within any particular ECC codeword 204. That is, it is desired to reserve a portion of the capacity of ECC scheme to deal with a minimum of, say, two, four, or six as yet unidentifiable (or as yet not existent) failed symbols in each ECC codeword 204. For example, if this minimum number of new full errors that can be reliably identified and corrected is chosen to be six then the preferred threshold would be set to be (maximum power)−2 *(minimum number)=32−(2*6)=20.

Step 508 comprises determining whether or not to continue use of the selected set of storage cells 16. If desired, remedial action can be taken. Such remedial action may take any suitable form, to manage future activity in the storage cells 16. As one example, the set of storage cells 16 corresponding to a codeword 204 or to a complete encoded sector 202 are marked and discarded, in order to avoid possible loss of data in future. In the currently preferred embodiments it is most convenient to use or discard sets of storage cells corresponding to an encoded sector 202, although greater or lesser granularity can be applied as desired. In the preferred embodiment, each sector comprises four codewords, and a sector is made redundant where the failure count for the set of storage cells for any one of its four codewords is greater than the threshold value.

The test method has been described, for simplicity, on the basis of a single sector 202 and its constituent codewords 204. In a practical embodiment, the method is applied on a much larger scale, preferably to evaluate in one operation a large area of the MRAM device 1, capable of storing many sectors. Ideally, the test method is applied to the whole device in a single operation.

The test method of FIG. 5 is particularly useful as a test procedure immediately following manufacture of the device, or at installation, or at power up, or at any convenient time subsequently. In particular, it is useful to apply the method of FIG. 5 to identify areas of the MRAM device which are severely affected by systematic errors caused by manufacturing imperfections, and remedial action can then be taken before the device is put into active use storing variable user data. The test method helps to provide a practical device which is able to take advantage of the considerable benefits offered by the new MRAM technology whilst minimising the limitations of current available manufacturing techniques.

The MRAM device described herein is ideally suited for use in place of any prior solid-state storage device. In particular, the MRAM device is ideally suited both for use as a short-term storage device (e.g. cache memory) or a longer-term storage device (e.g. a solid-state hard disk). An MRAM device can be employed for both short term storage and longer term storage within a single apparatus, such as a computing platform.

A magnetoresistive solid-state storage device and a method for testing such a device have been described. Advantageously, the storage device is able to tolerate a relatively large number of errors, including both systematic failures and transient failures, whilst successfully remaining in operation with no loss of original data. Simpler and lower cost manufacturing techniques are employed and/or device yield and device density are increased. As manufacturing processes improve, overhead of the employed ECC scheme can be reduced. However, error correction coding and decoding allows blocks of data, e.g. sectors or codewords, to remain in use, where otherwise the whole block must be discarded if only one failure occurs. Therefore, the preferred embodiments of the present invention avoid large scale discarding of logical blocks and reduce or even eliminate completely the need for inefficient control methods such as large-scale data mapping management or physical sparing.

The invention claimed is:

1. A method for testing a magnetoresistive solid-state storage device comprising:
    selecting a set of magnetoresistive storage cells, the set being arranged during use of the device to store at least one block of error correction coding encoded data;
    identifying as visible failures storage cells having read values out of a predetermined range of read values;
    identifying as hidden failures storage cells having erroneous read values situated in the predetermined range of read values; and
    determining whether the visible failures and the hidden failures identified in the set of magnetoresistive storage cells can prevent the set of magnetoresistive storage cells from suitably storing the at least one block of error correction coding encoded data.

2. The method of claim 1, comprising performing a write-read-compare operation on the selected set of storage cells, to identify bidden failures.

3. The method of claim 2, wherein the write-read-compare operation comprises:
writing test data to the selected set of storage cells;
reading the test data from the selected set of storage cells; and
comparing the written test data to the read test data.

4. The method of claim 3, wherein the hidden failures include half-select bits or single failed bits.

5. The method of claim 1, comprising comparing a parametric value obtained from each storage cell against said predetermined range to identify visible failures.

6. The method of claim 5, comprising:
obtaining a parametric value for each of the set of storage cells;
comparing each parametric value against said predetermined range; and
identifying a failed cell or cells, amongst the set of storage cells, as being affected by a visible failure, where the parametric value falls outside said predetermined range.

7. The method of claim 1, comprising:
forming a failure count based on the identified visible failures and the identified hidden failures; and
comparing the failure count against a threshold value.

8. The method of claim 7, wherein the failure count is formed for each block of storage cells which will, during use of the device, store a block of error correction coding encoded data.

9. The method of claim 8, wherein the block of cells comprises a plurality of symbol groups, each symbol group comprising one or more storage cells which will during use of the device store a symbol of error correction coding encoded data.

10. The method of claim 9, wherein forming the failure count comprises:
applying a weighted value to each symbol group; and
summing the weighted values for the symbol groups within each block of storage cells.

11. The method of claim 10, comprising:
applying a first weighted value where any storage cell in a symbol group is identified as a visible failure; and
applying a second weighted value where any storage cell in a symbol group is identified as a hidden failure.

12. The method of claim 11, wherein the second weighted value has twice the weight of the first weighted value.

13. The method of claim 12, wherein the first weighted value is applied in precedence to the second weighted value.

14. The method of claim 11, comprising applying a third weighted value to each symbol group not applied the first weighted value or the second weighted value, the third weighted value having a weight of "0".

15. The method of claim 7, wherein the threshold value represents a maximum power of an error correction coding scheme to be employed during use of the device to reliably correct a block of error correction coding encoded data.

16. The method of claim 15, wherein the threshold value is set to be in the range of about 50% to about 95% of the maximum power.

17. A magnetoresistive solid-state storage device, comprising:
at least one array of magnetoresistive storage cells;
an error correction coding unit for encoding original information to form at least one block of error correction coding encoded data, and for decoding error correction coding encoded data to recover information;
a controller arranged to store the at least one block of error correction coding encoded data in a set of the storage cells, and to read the stored error correction coding encoded data from the storage cells; and
a test unit arranged:
to select a set of magnetoresistive storage cells, the set being arranged to store at least one block of error correction coding encoded data,
to identify as visible failures storage cells that have read values out of a predetermined range of read values to identify as hidden failures storage cells that have erroneous read values situated in the predetermined range of read values and to determine whether the visible failures and the hidden failures identified in the set of magnetoresistive storage cells can prevent said set of magnetoresistive storage cells from suitably storing the at least one block of error correction coding encoded data.

18. An apparatus comprising the magnetoresistive solid-state storage device of claim 17.

19. A method for testing a magnetoresistive solid-state storage device, comprising:
selecting a set of magnetoresistive storage cells, the set being arranged during use of the device to store at least one block of error correction coding encoded data;
identifying as a visible failure any storage cell having a read value that is distinguishable by itself from any non-erroneous read value;
identifying as a hidden failure any storage cell having an erroneous read value that is not distinguishable by itself from a non-erroneous read value; and
determining whether the visible failures and the hidden failures identified in the set of magnetoresistive storage cells can prevent the set of magnetoresistive storage cells from suitably storing the at least one block of error correction coding encoded data.

* * * * *